(12) United States Patent
Furuya

(10) Patent No.: US 8,998,561 B2
(45) Date of Patent: Apr. 7, 2015

(54) GRIPPING DEVICE, TRANSFER DEVICE, PROCESSING DEVICE, AND MANUFACTURING METHOD FOR ELECTRONIC DEVICE

(75) Inventor: Masaaki Furuya, Kanagawa-ken (JP)

(73) Assignee: Shibaura Mechatronics Corporation, Yokohama (JP)

( * ) Notice: Subject to any disclaimer, the term of this patent is extended or adjusted under 35 U.S.C. 154(b) by 785 days.

(21) Appl. No.: 13/171,500

(22) Filed: Jun. 29, 2011

(65) Prior Publication Data

US 2012/0004773 A1 Jan. 5, 2012

(30) Foreign Application Priority Data

Jul. 2, 2010 (JP) ................................. 2010-152451
Jun. 16, 2011 (JP) ................................. 2011-134501

(51) Int. Cl.
*B25J 15/00* (2006.01)
*B25J 11/00* (2006.01)
(Continued)

(52) U.S. Cl.
CPC .............. *B25J 15/00* (2013.01); *B25J 11/0095* (2013.01); *H01L 21/67766* (2013.01);
(Continued)

(58) Field of Classification Search
CPC ................ B25J 9/02; B25J 9/04; B25J 9/042; B25J 9/043; B25J 9/044; B25J 9/046; B25J 9/047; B25J 11/0095; B25J 15/0033; B25J 15/0038; B25J 15/009; B25J 15/0273; B25J 15/103; H01L 21/67766; H01L 21/67778; H01L 21/67781; H01L 21/683; H01L 21/687; H01L 21/68707; H01L 21/68721; H01L 21/68728; H01L 21/6875; H01L 221/683

USPC ............. 414/222.07, 222.08, 225.01, 226.05, 414/744.3, 744.4, 744.5, 744.6, 744.7, 414/744.8, 751.1, 937, 941; 901/32, 36, 38, 901/39

See application file for complete search history.

(56) References Cited

U.S. PATENT DOCUMENTS 3,655,070 A * 4/1972 Haydu ........................ 198/621.1
4,813,732 A * 3/1989 Klem .......................... 294/103.1
(Continued)

FOREIGN PATENT DOCUMENTS

JP 2008-178924 A 8/2008
KR 10-0814140 B1 3/2008
(Continued)

OTHER PUBLICATIONS

Korean Office action for 10-2011-0065582 dated Dec. 11, 2012.
(Continued)

*Primary Examiner* — Dean Kramer
*Assistant Examiner* — Brendan Tighe
(74) *Attorney, Agent, or Firm* — Pearne & Gordon LLP

(57) ABSTRACT

According to one embodiment, a gripping device grips a rim of a workpiece by opening and closing gripping plates. The device includes a gripping unit, a hoisting and lowering unit and a motion control unit. The gripping unit includes a first and a second gripping plate. The first gripping plate has a first gripper to contact the rim. The second gripping plate has a second gripper to contact the rim. At least one of the first and second gripping plates is moved and the first and second gripper are spaced from each other. The hoisting and lowering unit is configured to hoist and lower the gripping unit. The motion control unit is configured to control open/close operations and hoisting and lowering operations. The motion control unit mechanically controls first first hoisting and lowering operations, controls second the open/close operations, and controls third second hoisting and lowering operations.

16 Claims, 10 Drawing Sheets

(51) Int. Cl.
*H01L 21/677* (2006.01)
*H01L 21/687* (2006.01)

(52) U.S. Cl.
CPC ... *H01L 21/67778* (2013.01); *H01L 21/67781* (2013.01); *H01L 21/68707* (2013.01); *Y10S 414/141* (2013.01); *Y10S 901/32* (2013.01); *Y10S 901/36* (2013.01); *Y10S 901/38* (2013.01); *Y10S 901/39* (2013.01)

(56) References Cited

U.S. PATENT DOCUMENTS

| | | | |
|---|---|---|---|
| 5,022,695 A * | 6/1991 | Ayers | 294/197 |
| 6,275,748 B1 | 8/2001 | Bacchi | |
| 6,283,701 B1 * | 9/2001 | Sundar et al. | 414/744.5 |
| 6,540,468 B1 * | 4/2003 | Blattner et al. | 414/416.08 |
| 6,623,235 B2 * | 9/2003 | Yokota et al. | 414/744.8 |
| 6,817,640 B2 * | 11/2004 | Menon et al. | 294/103.1 |
| 7,140,655 B2 * | 11/2006 | Kesil et al. | 294/104 |
| 7,829,471 B2 | 11/2010 | Kumar | |
| 7,838,433 B2 | 11/2010 | Kumar | |
| 8,628,288 B2 * | 1/2014 | Duhamel et al. | 414/217 |
| 2003/0035711 A1 * | 2/2003 | Gilchrist | 414/744.5 |
| 2005/0129496 A1 | 6/2005 | Heiland et al. | |
| 2005/0281661 A1 * | 12/2005 | Kesil et al. | 414/744.5 |

FOREIGN PATENT DOCUMENTS

| | | |
|---|---|---|
| TW | I-294660 B | 3/2008 |
| TW | I-326796 B | 7/2010 |

OTHER PUBLICATIONS

Office Action issued in Taiwanese Patent Application No. 100123394 dated Feb. 20, 2014.

Office Action issued in corresponding Taiwanese Patent Application No. 100123394 dated Jul. 18, 2014.

* cited by examiner

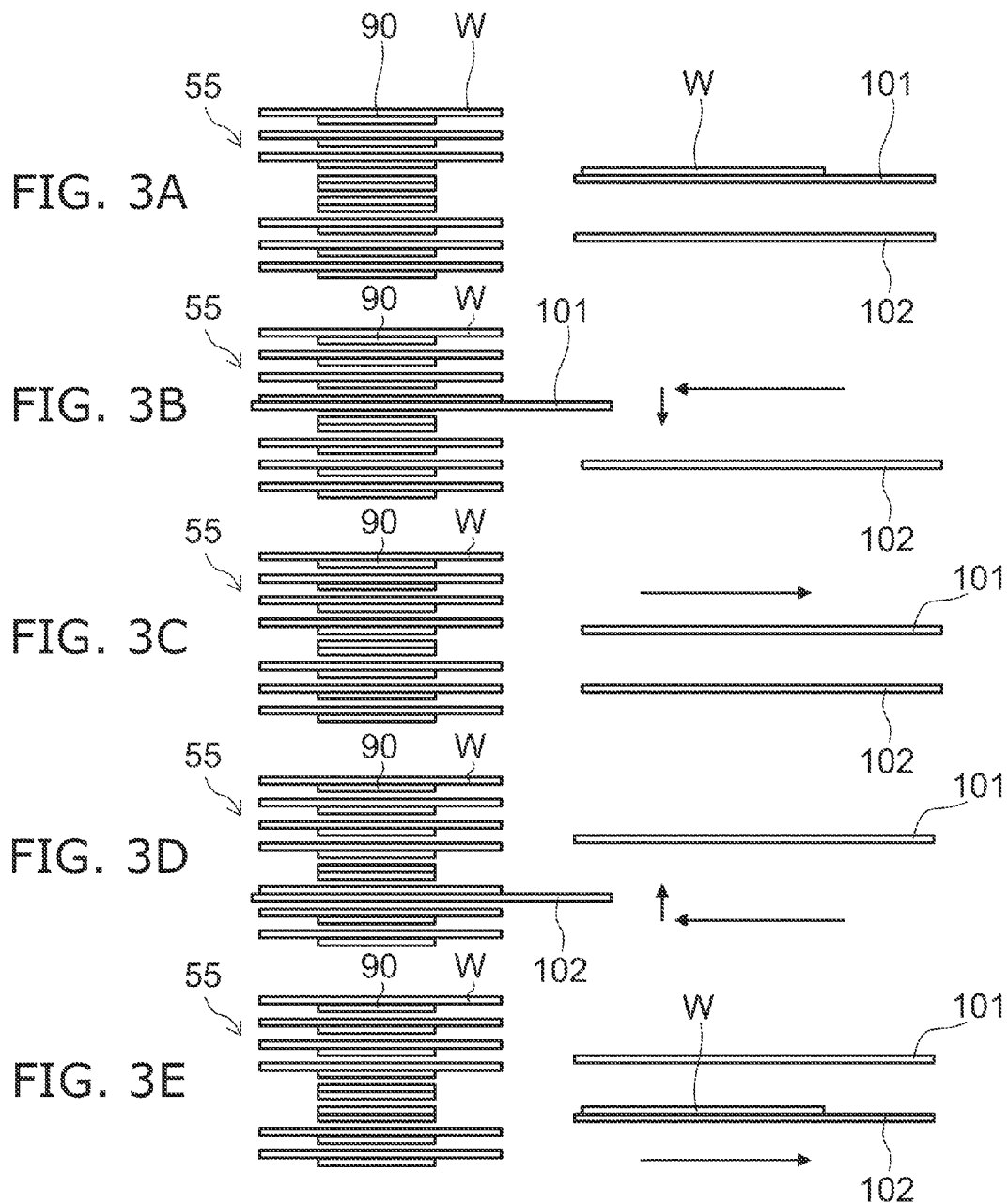

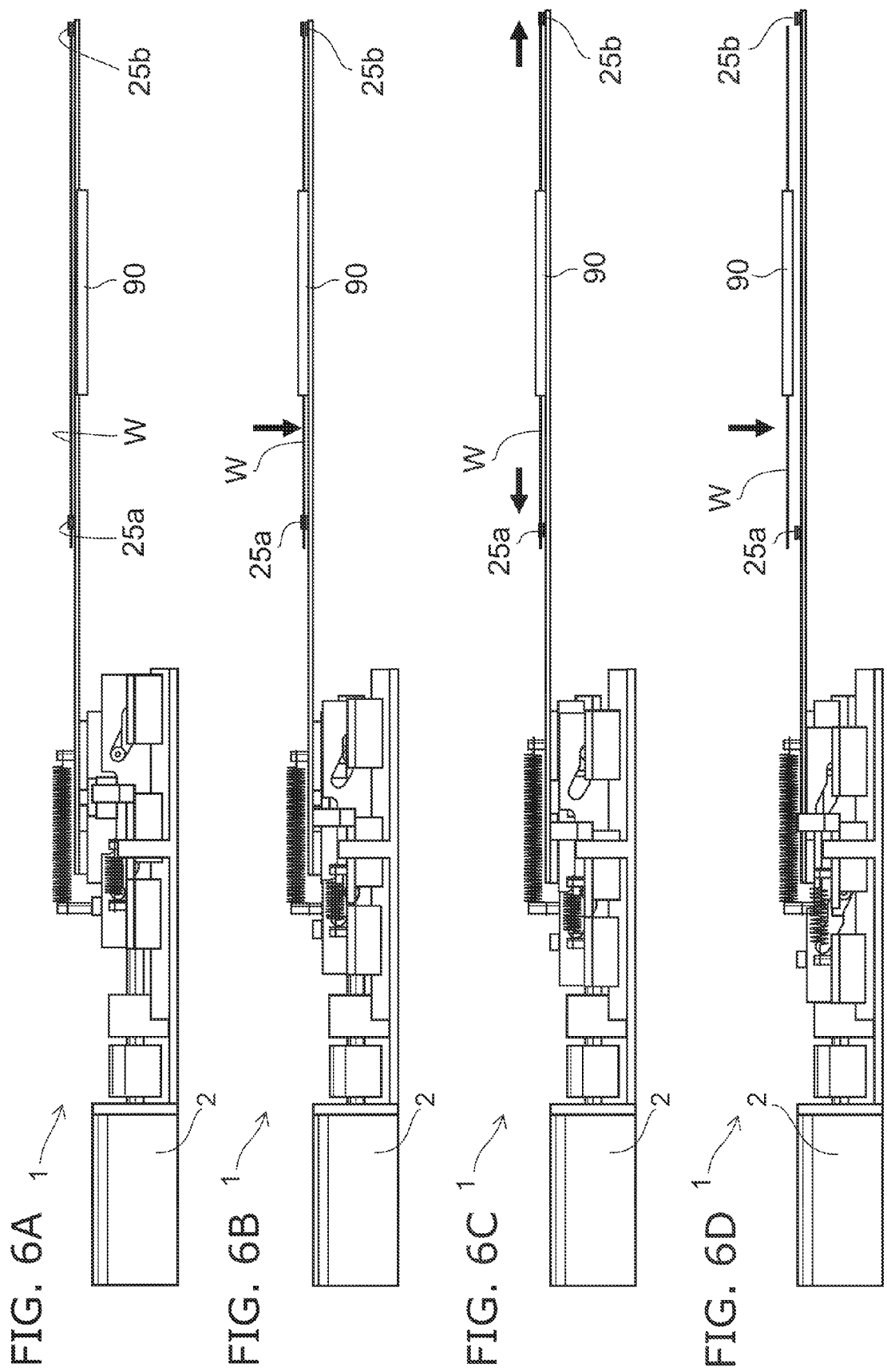

GRIPPING DEVICE, TRANSFER DEVICE, PROCESSING DEVICE, AND MANUFACTURING METHOD FOR ELECTRONIC DEVICE

CROSS-REFERENCE TO RELATED APPLICATIONS

This application is based upon and claims the benefit of priority from the prior Japanese Patent Application No. 2010-152451, filed on Jul. 2, 2010 and Japanese Patent Application No. 2011-134501, filed on Jun. 16, 2011; the entire contents of which are incorporated herein by reference.

BACKGROUND

1. Field

Embodiments described herein relate generally to a gripping device, a transfer device, a processing device, and a manufacturing method for an electronic device.

2. Description of the Related Art

In manufacture of electronic devices such as a semiconductor device, flat panel display, or the like, the transfer, supply, and so on of a plurality of workpieces (for example, wafers, glass substrates, or the like) are performed as the workpieces are stored in a storage unit such as a dedicated case, cassette, etc.

In manufacture using this storage unit, an unprocessed workpiece stored in the storage unit is unloaded and processed, and then the processed workpiece is again stored in the storage unit. A transfer device vertically having a plurality of arms is known as one that efficiently performs the delivery (unloading, storage, or the like) of workpieces in this manner. See JP-A 2008-178924 (Kokai), for example.

In this transfer device, a hoisting and lowering unit for the arms is shared, and the plurality of arms are hoisted and lowered at the same time. Because of this, in the case where workpieces are passed and received at a plurality of delivery positions, it is difficult to pass and receive workpieces at the same time using the plurality of arms, and it is necessary to pass and receive workpieces one by one.

In this case, if the hoisting and lowering unit is provided for each of the plurality of arms, workpieces can be passed and received at a plurality of delivery positions at the same time. However, the arm is provided with a gripping device that grips a workpiece. If a hoisting and lowering unit is separately provided, which is independently driven, this causes the complication, an increase in weight, or the like of mechanisms.

SUMMARY

In general, according to one embodiment, a gripping device grips a rim of a workpiece by opening and closing gripping plates. The device includes a gripping unit, a hoisting and lowering unit and a motion control unit. The gripping unit includes a first gripping plate and a second gripping plate. The first gripping plate has a first gripper to contact the rim. The second gripping plate has a second gripper to contact the rim. At least one of the first gripping plate and the second gripping plate is moved and the first gripper and the second gripper are spaced from each other. The hoisting and lowering unit is configured to hoist and lower the gripping unit. The motion control unit is configured to control open/close operations by the gripping unit and hoisting and lowering operations by the hoisting and lowering unit. The motion control unit mechanically controls first first hoisting and lowering operations, controls second the open/close operations, and controls third second hoisting and lowering operations that perform hoisting and lowering in directions being same as directions in the first hoisting and lowering operations.

In general, according to one other embodiment, a transfer device includes a gripping device and a moving unit configured to change a position of the gripping device. The gripping device grips a rim of a workpiece by opening and closing gripping plates. The device includes a gripping unit, a hoisting and lowering unit and a motion control unit. The gripping unit includes a first gripping plate and a second gripping plate. The first gripping plate has a first gripper to contact the rim. The second gripping plate has a second gripper to contact the rim. At least one of the first gripping plate and the second gripping plate is moved and the first gripper and the second gripper are spaced from each other. The hoisting and lowering unit is configured to hoist and lower the gripping unit. The motion control unit is configured to control open/close operations by the gripping unit and hoisting and lowering operations by the hoisting and lowering unit. The motion control unit mechanically controls first first hoisting and lowering operations, controls second the open/close operations, and controls third second hoisting and lowering operations that perform hoisting and lowering in directions being same as directions in the first hoisting and lowering operations.

In general, according to one other embodiment, a processing device includes a transfer device, a storage unit and a processing unit. The transfer device includes a gripping device, and a moving unit configured to change a position of the gripping device. The storage unit is configured to store a plurality of workpieces in a stack. The processing unit is configured to process the workpieces. The gripping device grips a rim of a workpiece by opening and closing gripping plates. The device includes a gripping unit, a hoisting and lowering unit and a motion control unit. The gripping unit includes a first gripping plate and a second gripping plate. The first gripping plate has a first gripper to contact the rim. The second gripping plate has a second gripper to contact the rim. At least one of the first gripping plate and the second gripping plate is moved and the first gripper and the second gripper are spaced from each other. The hoisting and lowering unit is configured to hoist and lower the gripping unit. The motion control unit is configured to control open/close operations by the gripping unit and hoisting and lowering operations by the hoisting and lowering unit. The motion control unit mechanically controls first first hoisting and lowering operations, controls second the open/close operations, and controls third second hoisting and lowering operations that perform hoisting and lowering in directions being same as directions in the first hoisting and lowering operations.

In general, according to one other embodiment, a manufacturing method for an electronic device is disclosed. The method can include unloading an unprocessed workpiece out of a storage unit using a gripping device. The method can include processing the unprocessed workpiece unloaded from the storage unit. In addition, the method can include storing the processed workpiece in the storage unit using the gripping device. The gripping device grips a rim of a workpiece by opening and closing gripping plates. The device includes a gripping unit, a hoisting and lowering unit and a motion control unit. The gripping unit includes a first gripping plate and a second gripping plate. The first gripping plate has a first gripper to contact the rim. The second gripping plate has a second gripper to contact the rim. At least one of the first gripping plate and the second gripping plate is moved and the first gripper and the second gripper are spaced from each other. The hoisting and lowering unit is configured to hoist and lower the gripping unit. The motion control unit is configured to control open/close operations by the gripping unit and hoisting and lowering operations by the hoisting and lowering unit. The motion control unit mechanically controls first first hoisting and lowering operations, controls second the open/close operations, and controls third second hoisting and lowering operations that perform hoisting and lowering in directions being same as directions in the first hoisting and lowering operations.

BRIEF DESCRIPTION OF THE DRAWINGS

FIGS. 3A to 3E are schematic views illustrating a manner of loading and unloading according to a comparative example;
FIGS. 6A to 6D are schematic views illustrating the action of the gripping device;
FIG. 10A shows loading in the topmost stage of the placement unit 55,
FIG. 10B shows loading and unloading in the middle stage of the placement unit 55,
and FIG. 10C shows loading and unloading in the undermost stage of the placement unit 55.

DETAILED DESCRIPTION

Figure 1:
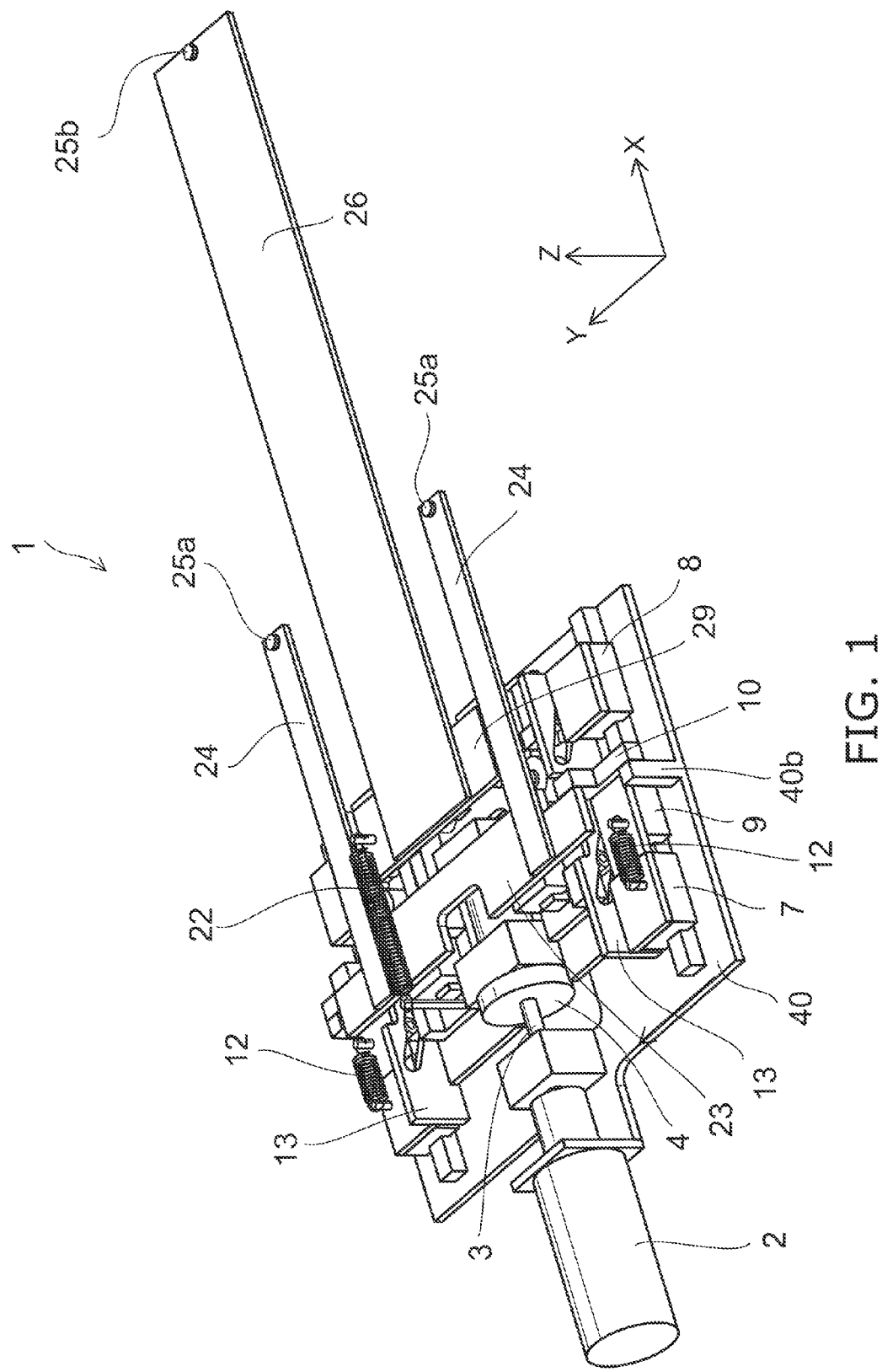
FIG. 1 is a schematic perspective view illustrating a gripping device according to an embodiment.

In the following, an embodiment will now be illustrated with reference to the drawings. In the drawings, similar components are marked with the same reference numerals, and a detailed description is omitted as appropriate.

Figure 2:
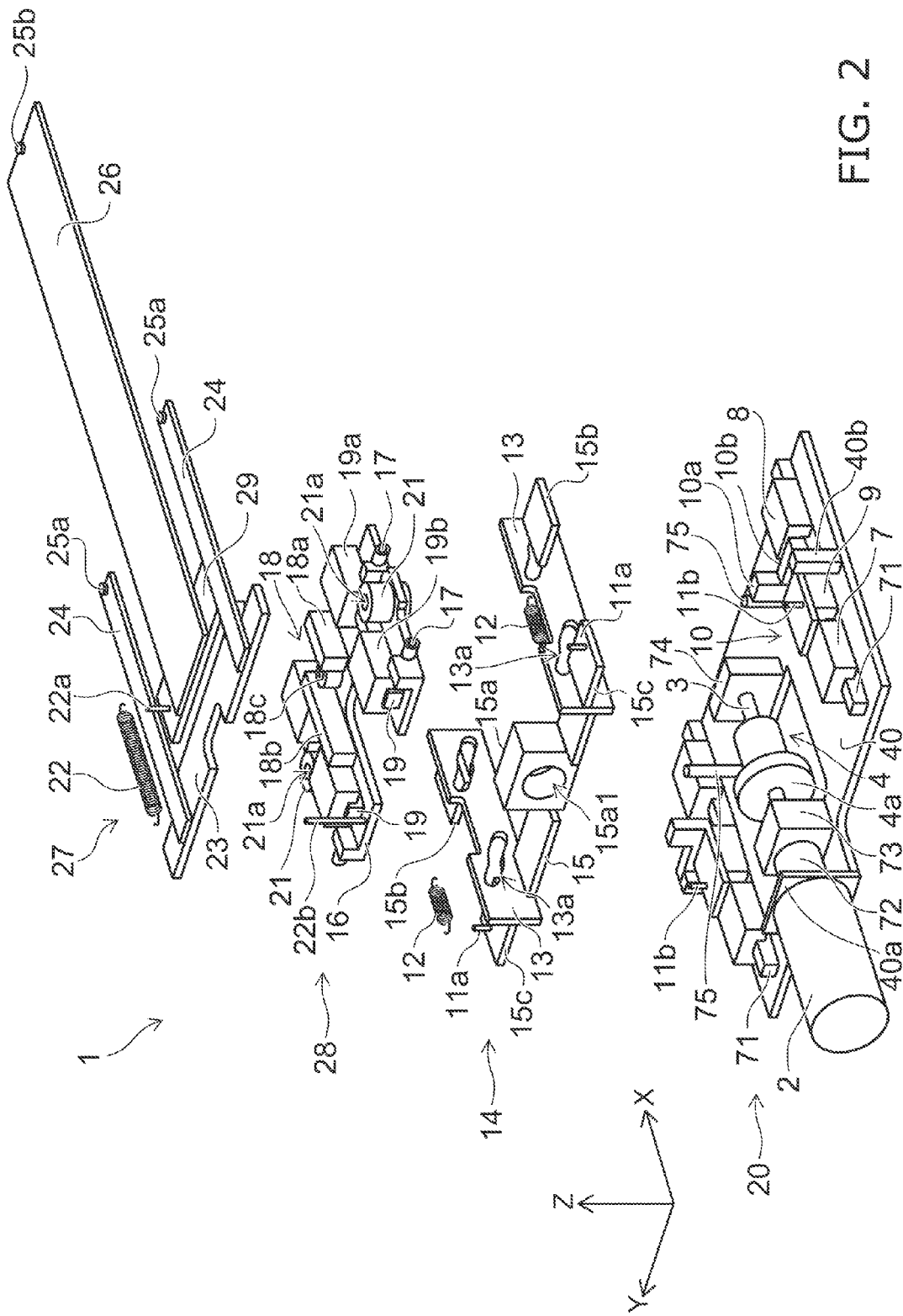
FIG. 2 is a schematic exploded view illustrating the gripping device according to the embodiment.

FIG. 1 is a schematic perspective view illustrating a gripping device according to an embodiment.
FIG. 2 is a schematic exploded diagram illustrating the gripping device according to the embodiment.
FIGS. 3A to 3E are schematic views illustrating a manner of loading and unloading according to a comparative example.

Arrows X, Y, and Z in FIGS. 1 and 2 represent three directions orthogonal to each other; X and Y represent the horizontal direction, and Z represents the vertical direction, for example.

First, a manner of loading and unloading according to a comparative example is illustrated.

FIGS. 3A to 3E show steps in midway of a series of processing operations. For example, FIGS. 3A to 3E show a manner of loading and unloading workpieces W at a placement unit 55 (see FIGS. 8A to 8C) performed in a series of processing operations.

In this case, processed workpieces W are placed in the upper part of the placement unit 55 and unprocessed workpieces W are placed in the lower part of the placement unit 55.

A transfer device that transfers workpieces W between a processing unit and the placement unit 55 is provided with arms 101 and 102. The arm 101 is provided with a gripping device, not shown, that is provided above the arm 102 to grip a workpiece W.

A hoisting and lowering unit, not shown, that is provided in the transfer device is shared between the arms 101 and 102, and the arms 101 and 102 are hoisted and lowered at the same time.

The arms 101 and 102 are positioned in front of the placement unit 55 by the transfer device for starting to load and unload workpieces W.

First, as shown in FIG. 3A, the position of the arm 101 that grips a processed workpiece W is positioned in the height direction by the hoisting and lowering unit, not shown. In doing so, the position of the underside of the processed workpiece W is positioned at a position slightly higher than the position of the top face of a holder 90 that holds this workpiece W in the placement unit 55.

In this manner, the arm 101 is once stopped and positioned at a predetermined position above the holder 90, so that it is possible to reduce an impact when contacting the workpiece W with the holder 90 in placing the workpiece W on the holder 90. Thus, it is possible to eliminate an event that the workpiece W hops or the position is shifted in placing the workpiece W on the holder 90.

Subsequently, as shown in FIG. 3B, the arm 101 is moved toward the placement unit 55. The position of the underside of the workpiece W inserted into the inside of the placement unit 55 is positioned at a position slightly higher than the position of the top face of the holder 90. The gripping of the workpiece W is released, the arm 101 is lowered by the hoisting and lowering unit, not shown, and then the processed workpiece W is placed on the holder 90. At this time, the arm 101 is lowered as it is, and positioned at the position between the processed workpiece W and a holder 90 adjacent below.

Subsequently, as shown in FIG. 3C, the arm 101 is moved to the direction apart from the placement unit 55.

Subsequently, as shown in FIG. 3D, the position of the arm 102 is positioned in the height direction in order to unload an unprocessed workpiece W out of the placement unit 55. At this time, the arm 102 is positioned at such a position that a slight gap is produced between the underside of the unprocessed workpiece W placed in the placement unit 55 and the arm 102.

In this manner, the arm 102 is once stopped and positioned at a predetermined position below the holder 90, so that it is possible to reduce an impact when contacting the workpiece W with the arm 102 in holding the workpiece W with the arm 102. Thus, it is possible to eliminate an event that the workpiece W hops or the position is shifted in holding the workpiece W with the arm 102.

The arm 102 is then moved toward the placement unit 55. The arm 102 inserted into the inside of the placement unit 55 is positioned below the unprocessed workpiece W. After that, the arm 102 is hoisted with the hoisting and lowering unit, not shown, and the unprocessed workpiece W is placed on the arm 102. At this time, the arm 102 is hoisted as it is, and positioned at the position between the unprocessed workpiece W and a holder 90 adjacent above. The unprocessed workpiece W placed on the arm 102 is gripped by the gripping device, not shown.

Subsequently, as shown in FIG. 3E, the arm 102 is moved to the direction apart from the placement unit 55. In this manner, the processed workpiece W and the unprocessed workpiece W are loaded and unloaded. It is possible to also load and unload processed workpieces W and unprocessed workpieces W at the processing unit by the similar operations.

As discussed above, the hoisting and lowering unit, not shown, provided in the transfer device is shared between the arms 101 and 102, and the arms 101 and 102 are hoisted and lowered at the same time. Because of this, in the case where workpieces W are passed and received between two holders 90, it is necessary to pass and receive the workpieces W one by one as illustrated in FIGS. 3A to 3E.

In this case, it is possible to pass and receive workpieces W at the same time between two holders 90 if the hoisting and lowering unit is provided for each of the arms 101 and 102. However, it is necessary to provide the gripping device that grips a workpiece W for the arms 101 and 102, and this causes the complication, an increase in weight, or the like of mechanisms if a hoisting and lowering unit is separately provided, which is independently driven.

Next, referring to FIGS. 1 and 2, the gripping device according to the embodiment will be illustrated.

As shown in FIGS. 1 and 2, a gripping device 1 is provided with a gripping unit 27, hoisting and lowering unit 28, motion control unit 14, and driving unit 20.

The gripping unit 27 is provided with a gripping plate 24 (second gripping plate) and a gripping plate 26 (first gripping plate) that grip a workpiece W.

The gripping plate 26 is provided so as to extend in the X-direction, and a gripper 25b (first gripper) is provided at one end of the gripping plate 26 to contact the rim of a workpiece W. The top face of the gripping plate 26 is formed to place a workpiece W thereon. A mounting plate 29 is provided on the other end of the gripping plate 26. The mounting plate 29 is provided so as to extend in the Y-direction, and a spring post 22a is provided at one end thereof. The mounting plate 29 is mounted with a rack 18a and a guide block 19a, described later.

Two gripping plates 24 are provided at symmetric positions as the gripping plate 26 is sandwiched therebetween. The gripping plate 24 is provided so as to extend in the X-direction, and a gripper 25a (second gripper) that contacts with the rim of a workpiece W is provided at each one end of the gripping plates 24. A mounting plate 23 is provided at the other end of the gripping plate 24. The mounting plate 23 is provided so as to extend in the Y-direction. The mounting plate 23 is mounted with a rack 18b and a guide block 19b, described later. Although the case is illustrated where three grippers (two grippers 25a and the gripper 25b) are contacted with the rim of a workpiece W, it is sufficient to provide the grippers more than one. However, it is possible to stabilize the gripping of a workpiece W if three or more of the grippers are used.

A hook provided at one end of the spring 22 is hooked on the spring post 22a, and a hook provided at the other end is hooked on a spring post 22b, described later.

The tip of the gripping plate 26 is provided at the position extending in the X-direction more than the tip of the gripping plate 24, and the position of the gripper 25b is also provided at the position extending in the X-direction more than the position of the gripper 25a. A workpiece W is placed on the top face of the gripping plate 26, the grippers 25a and 25b are brought into contact with the rim of the workpiece W, and then the spring 22 applies urging force to grip the workpiece W.

An open/close synchronizing unit 18 reverses the moving direction of the gripping plate 26 and the moving direction of the gripping plate 24 to each other in open/close operations.

The open/close synchronizing unit 18 is provided with the racks 18a and 18b and a pinion gearwheel 18c that engage with them. The pinion gearwheel 18c is rotatably mounted on a shaft, not shown, that is erected from the top face of a base plate 16, described later. As discussed above, because the rack 18a is mounted on the mounting plate 29 and the rack 18b is mounted on the mounting plate 23, if any one of the gripping plate 26 and the gripping plates 24 is moved, it is possible to move the other in the opposite direction. Thus, it is possible to grip a workpiece W or release the gripping of a workpiece W placed on the gripping unit 27.

A so-called rack and pinion mechanism is illustrated as the open/close synchronizing unit 18, but the open/close synchronizing unit 18 is not limited thereto. It is possible to appropriately use a mechanism that can mechanically synchronize and perform the gripping of a workpiece W and the release of gripping of a workpiece W. It is also possible to use a link mechanism or the like, for example.

In the embodiment, the open/close operation is illustrated with respect to the mechanism of moving the gripping plate 24 and the gripping plate 26 reversely each other, however the gripping plate 24 and the gripping plate 26 may not always move. That is, one of the gripping plate 24 and the gripping plate 26 may be moved to grip and release the workpiece W.

In this case, for operating the only gripping plate 24, the gripping plate 26 is sufficient to be fixed to the base plate 16. In this way, the guide block 19a moving with the movement of the gripping plate 26 can be omitted. Because the gripping plate 24 and the gripping plate 26 are not necessary to move synchronously, the open/close synchronizing unit 18 can be omitted and the structure is allowed to be simplified.

For operating the only gripping plate 26, the gripping plate 24 is sufficient to be fixed to the base plate 16 without connecting the gripping plate 24 and the mounting plate 23. In this case, the moving mounting plate 23 causes the open/close synchronizing unit 18 to be operated and to open/close the only gripping plate 26. In this case, the mounting plate 23 and the open/close synchronizing unit 18 cannot be omitted, but the gripping plate 24 and the base plate 16 can be unified, then the structure can be simplified.

In this manner, the gripping unit is configured so that the gripping plate 24 or the gripping plate 26 is movable relatively in a direction of separating from each other, and thus the workpiece W can also be gripped and released.

The hoisting and lowering unit 28 is provided with the base plate 16. On the top face of the base plate 16, a pair of guide rails 19 are provided so as to extend in the X-direction in parallel with each other. Each of the guide rails 19 is provided with the guide blocks 19a and 19b that slide on the guide rail 19. Thus, it is possible to move the gripping plate 26 in the X-direction through the mounting plate 29 mounted on the guide block 19a. In addition, it is possible to move the gripping plate 24 in the X-direction through the mounting plate 23 mounted on the guide block 19b.

A pair of bearings 21 are provided on the outer side of the guide rail 19 and near the center of the base plate 16 in the X-direction. A shaft 75, described later, is inserted into a hole 21a in the bearing 21, and the hoisting and lowering unit 28 can be hoisted and lowered along the shaft 75.

Thus, the hoisting and lowering unit 28 is possible to hoist and lower the gripping unit 27 mounted thereon.

A cam follower 17 is provided on the side surface of the base plate 16 in the Y-direction. The cam follower 17 is provided two each on the side surface on one side along the X-direction.

The spring post 22b is erected on the top face of the base plate 16, and the hook of the spring 22 is hooked on the spring post 22b.

A pair of cams 13 are provided in the motion control unit 14. The cam 13 is provided so as to extend in the X-direction. The major surface of the cam 13 is orthogonal in the Y-direction, and a cam hole 13a is provided in the major surface of the cam 13 to penetrate the cam 13. The cam hole 13a has a first slope unit 13a1, horizontal unit 13a2, and second slope unit 13a3, and the cam follower 17 engages with the cam hole 13a (see FIG. 4). Thus, it is possible to hoist and lower the hoisting and lowering unit 28 at a predetermined timing as the shape of the cam hole 13a is followed.

In the embodiment, four cam followers 17 and two bearings 21 are used. Thus, it is possible to move, hoist, and lower the hoisting and lowering unit 28 as it keeps the state vertical to the Z-axis (the state parallel with the X-Y plane). In the embodiment, a pair of cams are provided opposed each other, and the cams include two pairs of cam holes. All cam holes provided in the pair of cams have similar figure, and thus the hoisting and lowering unit 28 can be stably hoisted and lowered.

However, the numbers of the cam follower 17 and the bearing 21 are not limited thereto. It is possible to reduce the numbers of the cam follower 17 and the bearing 21 to one or two, for example, using a guide mechanism, link mechanism, etc.

Mounting plates 15b and 15c are provided near each end of the cams 13. The mounting plate 15b is mounted on a guide block 8, described later, and the mounting plate 15c is mounted on a guide block 7, described later. Thus, it is possible to move the motion control unit 14 in the X-direction through the mounting plate 15b mounted on the guide block 8 and the mounting plate 15c mounted on the guide block 7.

A joint plate 15 is provided between the cams 13 near the end of the cams 13 where the mounting plate 15c is provided, and the joint plate 15 joins the cams 13 to each other. The joint plate 15 is provided with a boss 15a, and the boss 15a is provided with a hole 15a1 into which a nut 4, described later, is inserted.

A spring post 11a is provided on the mounting plate 15c. A hook provided at one end of a spring 12 is hooked on a spring post 11a, and a hook provided on the other end is hooked on a spring post 11b, described later.

A base plate 40 is provided in the driving unit 20. A pair of guide rails 71 are provided on the top face of the base plate 40 so as to extend in the X-direction in parallel with each other. The guide blocks 7, 8, and 9 that slide on the guide rail 71 are provided for each of the guide rails 71.

A bracket 40a is provided at one end of the base plate 40, and a motor 2 is mounted on the bracket 40a. The motor 2 can be a control motor or the like such as a servo motor, pulse motor, and so on, for example.

A screw 3 is mounted on the rotating shaft of the motor 2 through a coupling 72. Bearings 73 and 74 are provided near both ends of the screw 3 to so as to rotatably support the screw 3. The nut 4 is screwed on the screw 3. The nut 4 is inserted into the hole 15a1 provided in the boss 15a, and a flange 4a provided at the end of the nut 4 is mounted on the boss 15a. Thus, it is possible to transform the rotational motion of the motor 2 into translatory movement and to transmit this movement to the motion control unit 14. The operations of the individual components by the rotation of the motor 2 will be described later.

A pair of the shafts 75 are erected on the inner side of the guide rail 71 and near the center of the base plate 40 in the X-direction. As discussed above, the shaft 75 is formed to be inserted into the hole 21a in the bearing 21.

An open/close plate 10 is provided on the guide block 9. A projection 10a (first projection) that projects upward and a projection 10b (second projection) that projects toward the outer side of the base plate 40 are provided on one end of the open/close plate 10. The projection 10a is formed to contact the end surface of the mounting plate 23. The projection 10b is formed to contact a stopper 40b erected on the top face of the base plate 40. The spring post 11b is erected on the top face of the open/close plate 10, and the hook of the spring 12 is hooked on the spring post 11b. Because of this, in the case where the projection 10b is not retained by the stopper 40b, the open/close plate 10 and the motion control unit 14 are integrally moved by the urging force of the spring 12. In the case where the projection 10b is retained by the stopper 40b, the open/close plate 10 stops moving. On the other hand, the motion control unit 14 keeps moving against the urging force of the spring 12. Thus, it is possible to perform the open/close operations and hoisting and lowering operations of the gripping unit 27 (a move in the Z-direction), described later.

Next, the action of the gripping device 1 according to the embodiment will be illustrated.

FIGS. 4A to 6D are schematic views illustrating the action of the gripping device 1.

Figure 4A:
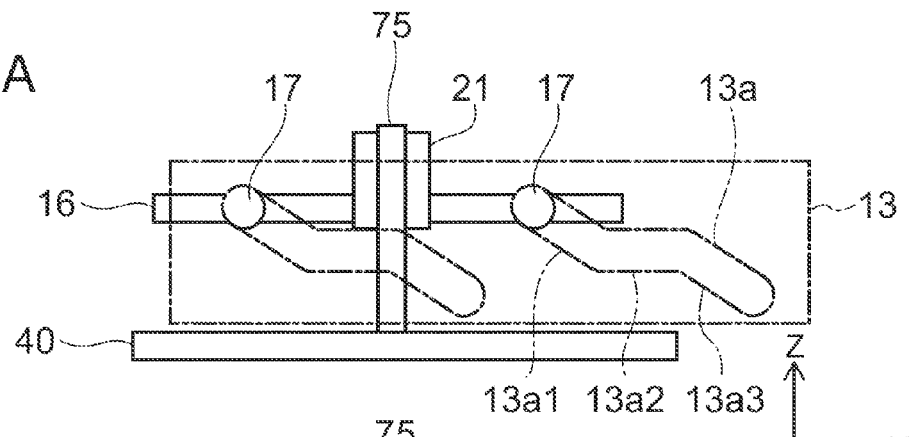
FIGS. 4A to 4D are schematic views illustrating the action of the gripping device.
Figure 5A:
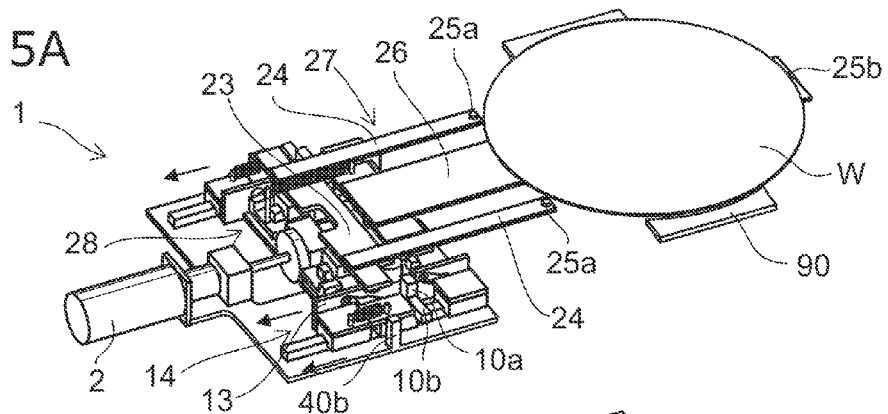
FIGS. 5A to 5D are schematic views illustrating the action of the gripping device.

As shown in FIGS. 4A, 5A, and 6A, when the motion control unit 14 (the cams 13) is at the projection end (on the opposite side of the side on which the motor 2 exists), the cam follower 17 is at a lift end position, that is, the gripping unit 27 is at the lift end position. At this time, the gripping plate 26 is drawn to the motor 2 side by the urging force of the spring 22. This causes the gripping plate 24 to project by the action of the open/close synchronizing unit 18, so that the gripping unit 27 is brought into the state in which it grips a workpiece W (in the closed state).

As shown in FIG. 5A, there is a gap between the projection 10a and the mounting plate 23, and between the projection 10b and the stopper 40b.

Figure 4B:
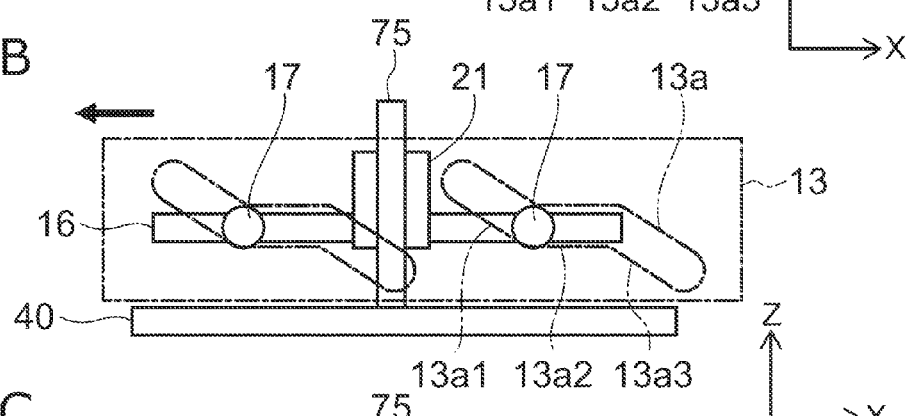
Figure 5B:
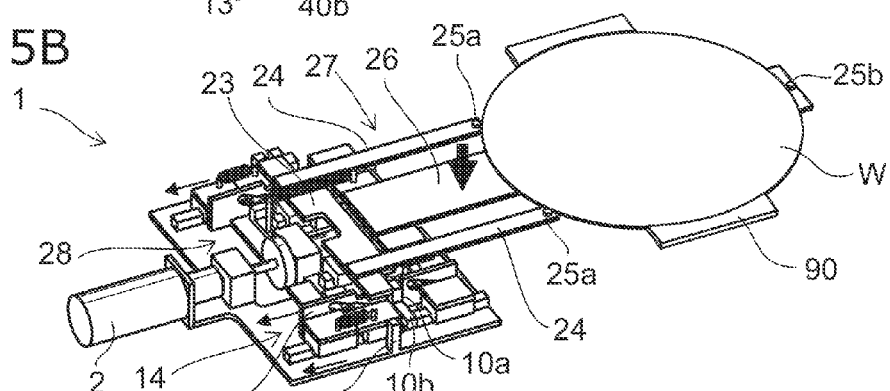

Subsequently, when the motor 2 moves the motion control unit 14 to the motor 2 side, the cams 13 are moved in the same direction. Because of this, as shown in FIGS. 4B, 5B, and 6B, the cam follower 17 is lowered along the first slope unit 13a1 of the cam hole 13a, that is, the gripping unit 27 is lowered. In this manner, it is possible to lower the gripping unit 27 as the gripping unit 27 keeps gripping the workpiece W (in the closed state).

Figure 4C:
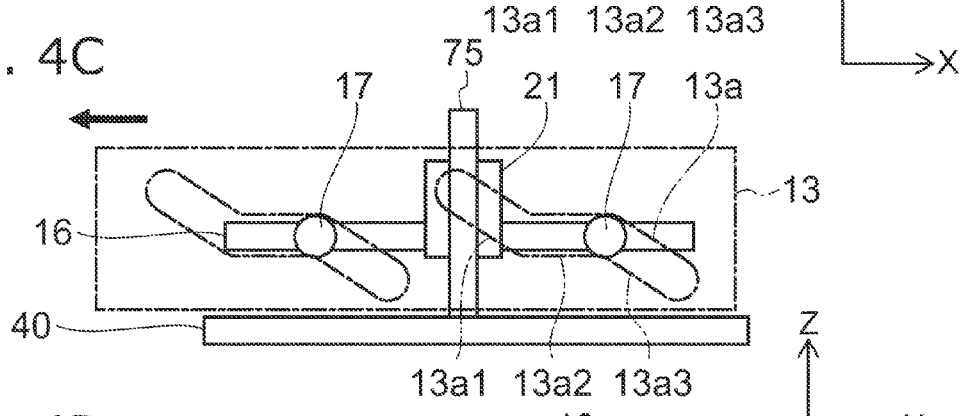
Figure 5C:
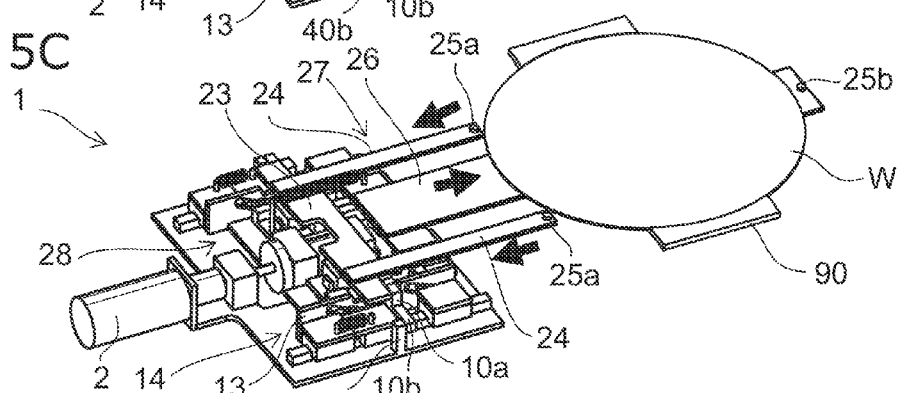

Subsequently, as shown in FIGS. 4C, 5C, and 6C, when the motor 2 moves the motion control unit 14 further to the motor 2 side, the cam follower 17 is moved along the horizontal unit 13a2 of the cam hole 13a. When the cam follower 17 enters the horizontal unit 13a2 of the cam hole 13a, the projection 10a is contacted with the mounting plate 23. Because of this, the projection 10a presses the mounting plate 23 in moving the cam follower 17 along the horizontal unit 13a2 of the cam hole 13a, and the gripping plate 24 is drawn to the motor 2 side. At this time, because the action of the open/close synchronizing unit 18 causes the gripping plate 26 to project, the gripping unit 27 is brought into the state in which it releases the workpiece W (in the open state). In moving the cam follower 17 to the end of the horizontal unit 13a2 of the cam hole 13a, the projection 10b is contacted with the stopper 40b. Thus, contacting the projection 10b with the stopper 40b causes the mounting plate 23 to stop moving, so that the aforementioned release operation of the workpiece W is stopped.

In this manner, it is possible to bring the workpiece W into the state in which it is released (in the open state) as the position of the gripping unit 27 is kept constant in the Z-direction.

In this case, in the configuration that the gripping plate 26 is fixed to the base plate 16 in order to operate the only gripping plate 24, the gripping plate 26 does not move and the only gripping plate 24 moves, and then the workpiece W is released.

On the other hand, in the configuration that the gripping plate 24 is fixed to the base plate 16 in order to operate the only gripping plate 26, the gripping plate 24 does not move and the only gripping plate 26 moves, and then the workpiece W is released. In this case, the ground plate 23 and the open/close synchronizing unit 18 operate similarly to the above description, and then the gripping plate 26 is spaced from the workpiece W.

Figure 4D:
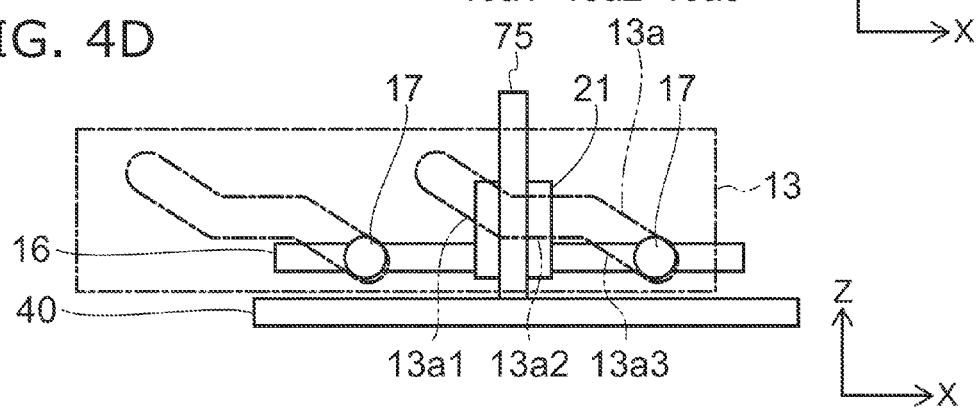
Figure 5D:
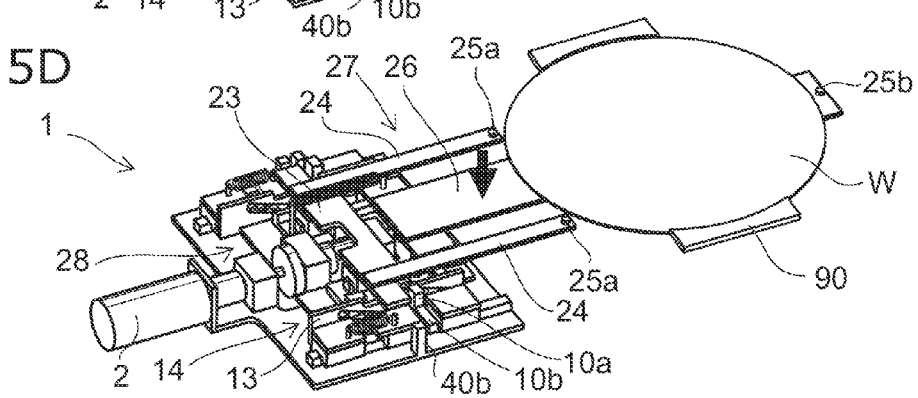

Subsequently, as shown in FIGS. 4D, 5D, and 6D, when the motor 2 moves the motion control unit 14 further to the motor 2 side, the cam follower 17 is lowered along the second slope unit 13a3 of the cam hole 13a, that is, the gripping unit 27 is lowered. Thus, it is possible to lower the gripping unit 27 as the workpiece W is kept released (in the open state).

As stated above, it is possible to perform the open/close operations and hoisting and lowering operations of the gripping unit 27 (a move in the Z-direction).

In addition, it is possible to perform the open/close operations and hoisting and lowering operations of the gripping unit 27 (a move in the Z-direction) by a procedure reverse to the aforementioned procedure if the motor 2 moves the motion control unit 14 to the opposite side of the motor 2 side.

More specifically, the motion control unit 14 is possible to mechanically control the first hoisting and lowering operations in the first slope unit 13a1, the open/close operations in the horizontal unit 13a2, and the second hoisting and lowering operations in the second slope unit 13a3 that hoists and lowers the gripping unit 27 in the same direction as in the first hoisting and lowering operations in the first slope unit 13a1, in this order. In other words, the motion control unit 14 performs the hoisting and lowering operations, and matches the timing of the hoisting and lowering operations with the timing of the open/close operations.

The motion control unit 14 has the cams 13, and mechanically controls the first hoisting and lowering operations, the open/close operations, and the second hoisting and lowering operations in this order using the cams 13.

In this case, in the case where the first and second hoisting and lowering operations are the hoisting operation, it is possible that the open/close operations are an operation that contacts the grippers 25a and 25b with the rim of the workpiece W (grip operation).

In the case where the first and second hoisting and lowering operations are the lowering operation, it is possible that the open/close operations are an operation that separates the grippers 25a and 25b from the rim of the workpiece W (release operation).

In addition, the hoisting and lowering directions of the hoisting and lowering unit 28 are not limited to the Z-axis direction. It may be possible to hoist and lower the gripping unit 27 as the top face of the gripping plate 26 (the surface on which the workpiece W is placed) provided in the gripping unit 27 is tiled to the X-Y plane. In other words, it is possible that the hoisting and lowering directions of the hoisting and lowering unit 28 are set in given directions if the first and second hoisting and lowering operations are performed in the same directions.

According to the embodiment, it is possible to perform the grip and release operations of the workpiece W and the hoisting and lowering operations of the workpiece W using the shared driving unit. Thus, it is possible to simplify the mechanism of the gripping device and to reduce the weight of the gripping device.

If the grip and release operations and the hoisting and lowering operations are performed by separate driving units as illustrated in FIGS. 3A to 3E, it is necessary to perform the operations after confirming the operation of the counterpart driving unit. More specifically, it is necessary to make a so-called interlock. Because of this, it is likely that a time lag occurs to prolong a time period required for loading and unloading workpieces W.

In contrast to this, according to the embodiment, because it is possible to mechanically control the procedures of the grip and release operations and the hoisting and lowering operations, an unnecessary time lag will not occur. In addition, it is possible to perform accurate operations at high speed. Thus, it is possible to shorten a time period required for loading and unloading workpieces W, and it is possible to improve productivity.

Next, a transfer device according to the embodiment will be illustrated.

It is possible to configure the transfer device according to the embodiment to include the aforementioned gripping device 1. For example, it can be configured to include the gripping device 1 and a moving unit that changes the position of the gripping device 1.

Figure 7:
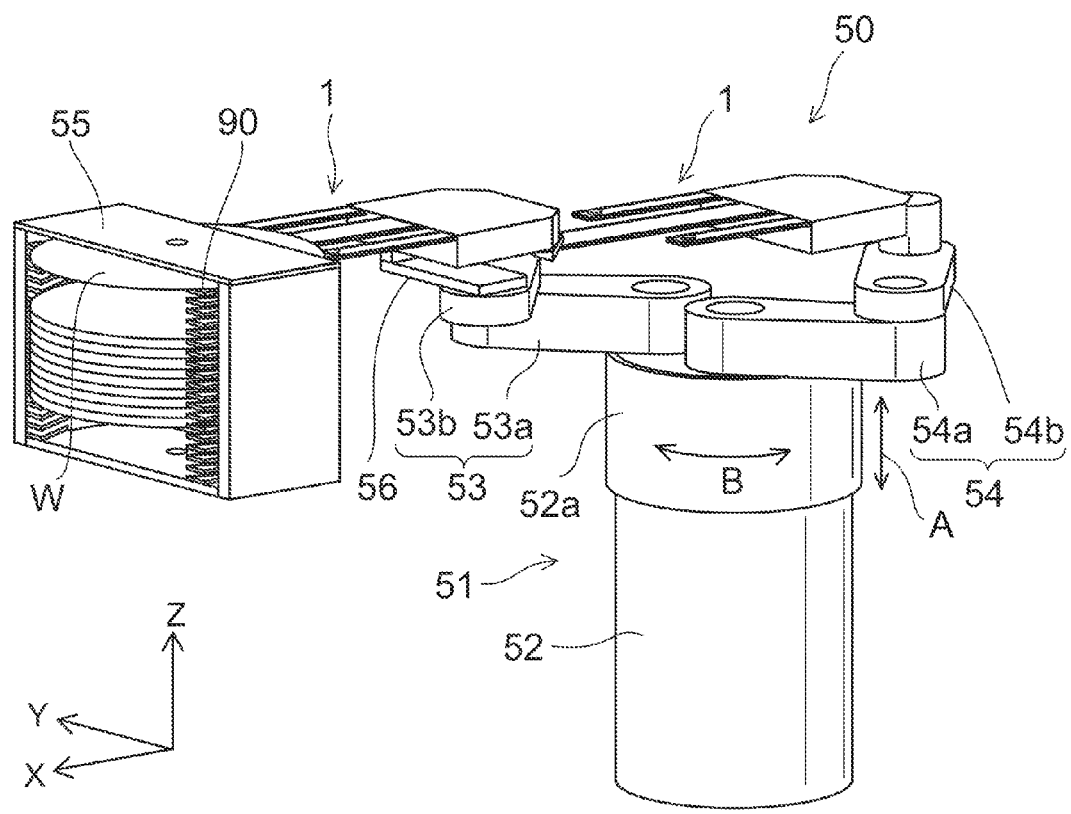
FIG. 7 is a schematic perspective view illustrating the transfer device according to the embodiment.

FIG. 7 is a schematic perspective view illustrating the transfer device according to the embodiment.

A transfer device 50 illustrated in FIG. 7 is the case of including the gripping device 1 and a so-called double arm horizontal articulated robot as the moving unit.

As shown in FIG. 7, the transfer device 50 is provided with the gripping device 1 and a horizontal articulated robot 51.

The horizontal articulated robot 51 is provided with a support unit 52 and arms 53 and 54.

The arms 53 and 54 are provided on the top face of a moving unit 52a that is provided at the top end of the support unit 52.

The arm 53 includes a first arm 53a provided on the top face of the moving unit 52a and a second arm 53b pivotably supported on the first arm 53a.

The arm 54 includes a first arm 54a provided on the top face of the moving unit 52a and a second arm 54b pivotably supported on the first arm 54a.

The support unit 52 is provided with a hoisting and lowering driving unit, not shown, that hoists and lowers the moving unit 52a in the direction of an arrow A, and a turn driving unit, not shown, that rotates the moving unit 52a in the direction of an arrow B.

The support unit 52 is provided with the arm 53, an expansion driving unit of the arm 53, not shown, the arm 54, and an expansion driving unit of the arm 54, not shown.

The gripping device 1 is provided on each of the tip of the second arm 53b and the tip of the second arm 54b.

The second arm 53b is connected to the gripping device 1 with a U-shaped member 56. Because of this, a space is formed between the second arm 53b and the gripping device 1. This space has such lengthwise and crosswise dimensions that the gripping device 1 provided on the arm 54 can pass therethrough when the second arm 54b is extended and retracted.

Because it is possible to adapt known techniques to the horizontal articulated robot 51, the detailed descriptions are omitted.

The distance between the two gripping devices 1 provided on each of the arm 53 and the arm 54 is adjustable in such a way that the distance is equal to an integral multiple of the pitch distance between the holders 90 when the individual gripping devices 1 grip and release a workpiece W (when the gripping devices 1 reach the position of the cam follower in FIGS. 4B, 4C, 5B, 5C, 6B, and 6C). The distance between the two gripping devices 1 is thus adjusted, so that it is possible to perform the operation that the gripping device 1 gripping a workpiece W places the workpiece W on the holder 90 and the operation that the gripping device 1 gripping no workpiece W receives a workpiece W from the holder 90 at the same time. The placement and reception on the holder 90 will be described later.

Next, the action of the transfer device 50 according to the embodiment will be illustrated.

Here, the loading and unloading of workpieces W at the transfer device 50 according to the embodiment will be illustrated as an example.

Figure 8A:
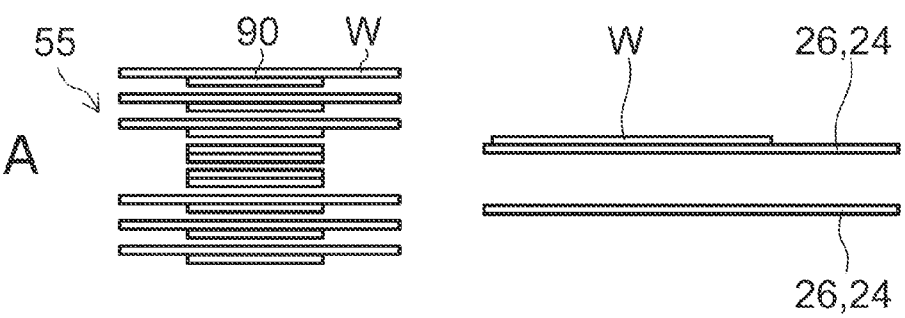
FIGS. 8A to 8C are schematic views illustrating a manner of loading and unloading workpieces at the transfer device according to the embodiment.
Figure 8B:
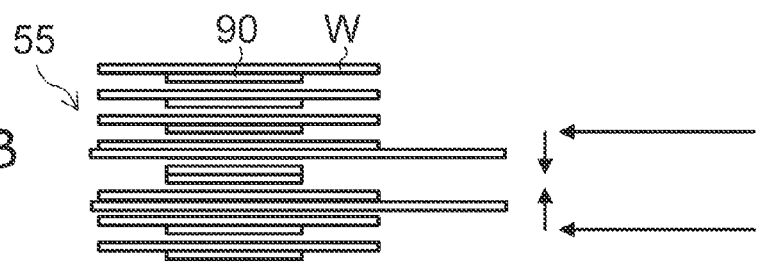
Figure 8C:
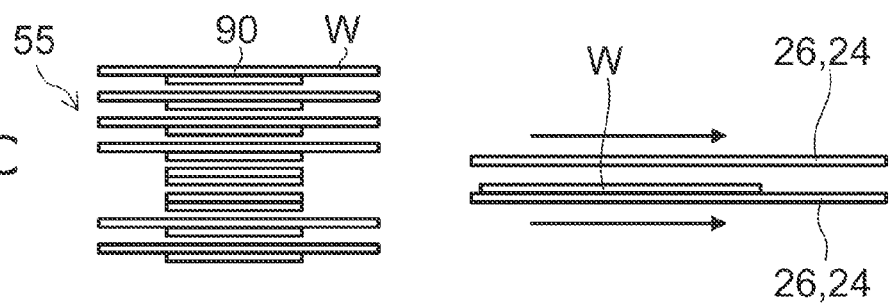

FIGS. 8A to 8C are schematic views illustrating a manner of loading and unloading workpieces W at the transfer device according to the embodiment.

FIGS. 8A to 8C show the steps in midway of a series of processing operations as an example. For example, a manner of loading and unloading workpieces W at the placement unit 55 (see FIGS. 8A to 8C) is shown, which is performed in a series of processing operations.

In this case, processed workpieces W are placed in the upper part of the placement unit 55 and unprocessed workpieces W are placed in the lower part of the placement unit 55.

The arms 53 and 54 and so on of the aforementioned horizontal articulated robot 51 are omitted in the drawings.

First, as shown in FIG. 8A, the arms 53 and 54 are positioned in front of the placement unit 55 by the horizontal articulated robot 51 for starting to load and unload workpieces W.

At this time, it is supposed that a processed workpiece W is placed and gripped on the gripping plates 24 and the gripping plate 26 of the gripping device 1 positioned above (corresponding to an example of the first gripping device) and no workpiece W is placed on the gripping plates 24 and the gripping plate 26 of the gripping device 1 positioned below (corresponding to an example of the second gripping device).

The position of the underside of the workpiece W gripped by the gripping device 1 positioned above is positioned in such a way that the position is at a position slightly higher than the position of the top face of the holder 90 when the workpiece W is lowered by the aforementioned first hoisting and lowering operations.

The positions of the top faces of the gripping plates 24 and the gripping plate 26 of the gripping device 1 positioned below are positioned at such positions that an unprocessed workpiece W held on the holder 90 can be slightly lifted when the unprocessed workpiece W is lifted by the aforementioned second hoisting and lowering operations.

Subsequently, as shown in FIG. 8B, the arms 53 and 54 are extended to insert the processed workpiece W gripped by the gripping device 1 positioned above and the gripping plates 24 and the gripping plate 26 of the gripping device 1 positioned below into the inside of the placement unit 55. The gripping device 1 positioned above is then operated to place the processed workpiece W on the holder 90. The gripping device 1 positioned below is operated to receive an unprocessed workpiece W from the holder 90.

In the case of performing these operations, the first and second hoisting and lowering operations of the gripping device 1 positioned above can be called a lowering operation, and the first and second hoisting and lowering operations of the gripping device 1 positioned below can be called a hoisting operation, for example. In other words, it is possible that the hoisting and lowering operations of the gripping device 1 positioned above and the hoisting and lowering operations of the gripping device 1 positioned therebelow are performed in the reverse directions to each other.

It may be possible that the hoisting and lowering operations of the individual gripping devices 1 are performed in the directions reverse to the foregoing directions, the gripping device 1 positioned above receives an unprocessed workpiece W from the holder 90, and the gripping device 1 positioned below places a processed workpiece W on the holder 90.

It is possible to receive and place (place and receive) workpieces W at the same time if the hoisting and lowering operations of the individual gripping devices 1 above and below are performed at the same time and in the reverse directions. Thus, it is possible to change workpieces W at the same time by operating the arms at one time that the arms are hoisted, lowered, extend, and retracted, and it is possible to shorten a time period for the operation of changing workpieces W to about a half of that in the comparative example which performs the transfer operation shown in FIGS. 3A to E.

Because the action of the gripping device 1 is similar to the aforementioned action, the detailed descriptions are omitted.

Subsequently, as shown in FIG. 8C, the arms 53 and 54 are retracted to move the gripping plates 24 and the gripping plate 26 of the gripping device 1 positioned above and the unprocessed workpiece W gripped by the gripping device 1 positioned below to the direction apart from the placement unit 55.

The gripping device 1 provided on the arm 54 is configured so as not to interfere with the gripping device 1 provided on the arm 53 as the gripping device 1 provided on the arm 54 passes through the space formed by the aforementioned member 56 in extending and retracting the arms 53 and 54.

In this manner, the processed workpiece W and the unprocessed workpiece W are loaded and unloaded. It is possible to load and unload processed workpieces W and unprocessed workpieces W at a storage unit 61 and processing units 65a to 65d, described later, by the similar operations.

The case is illustrated where the double arm horizontal articulated robot 51 is provided as the moving unit, but the moving unit is not limited thereto.

It is possible to appropriately select one that can change the position of the gripping device 1. For example, it may be possible to select a so-called vertical articulated robot, orthogonal robot, single axis robot, etc.

According to the embodiment, it is possible to cause the gripping device to perform the grip and release operation of a workpiece W, and also to perform the hoisting and lowering operations in loading and unloading. Thus, it is possible to pass and receive workpieces W at a plurality of delivery positions at the same time.

Because it is possible to mechanically control the procedures of the grip and release operations and the hoisting and lowering operations, an unnecessary time lag will not occur. Moreover, it is possible to perform accurate operations at high speed.

Furthermore, it is possible to simplify the mechanism of the gripping device and to reduce the weight of the gripping device, so that it is possible to reduce the load on the moving unit, to accelerate the operations, and so on.

Thus, it is possible to shorten a time period required for loading and unloading workpieces W, and it is possible to improve productivity.

Next, a processing device according to the embodiment will be illustrated.

It is possible to configure the processing device according to the embodiment to include the transfer device 50 having the aforementioned gripping device 1 and the moving unit that changes the position of the gripping device 1.

For example, it is possible to configure the processing device according to the embodiment to include the transfer device 50, the storage unit that stores a plurality of workpieces W in a stack, and the processing unit that processes workpieces W.

Figure 9:
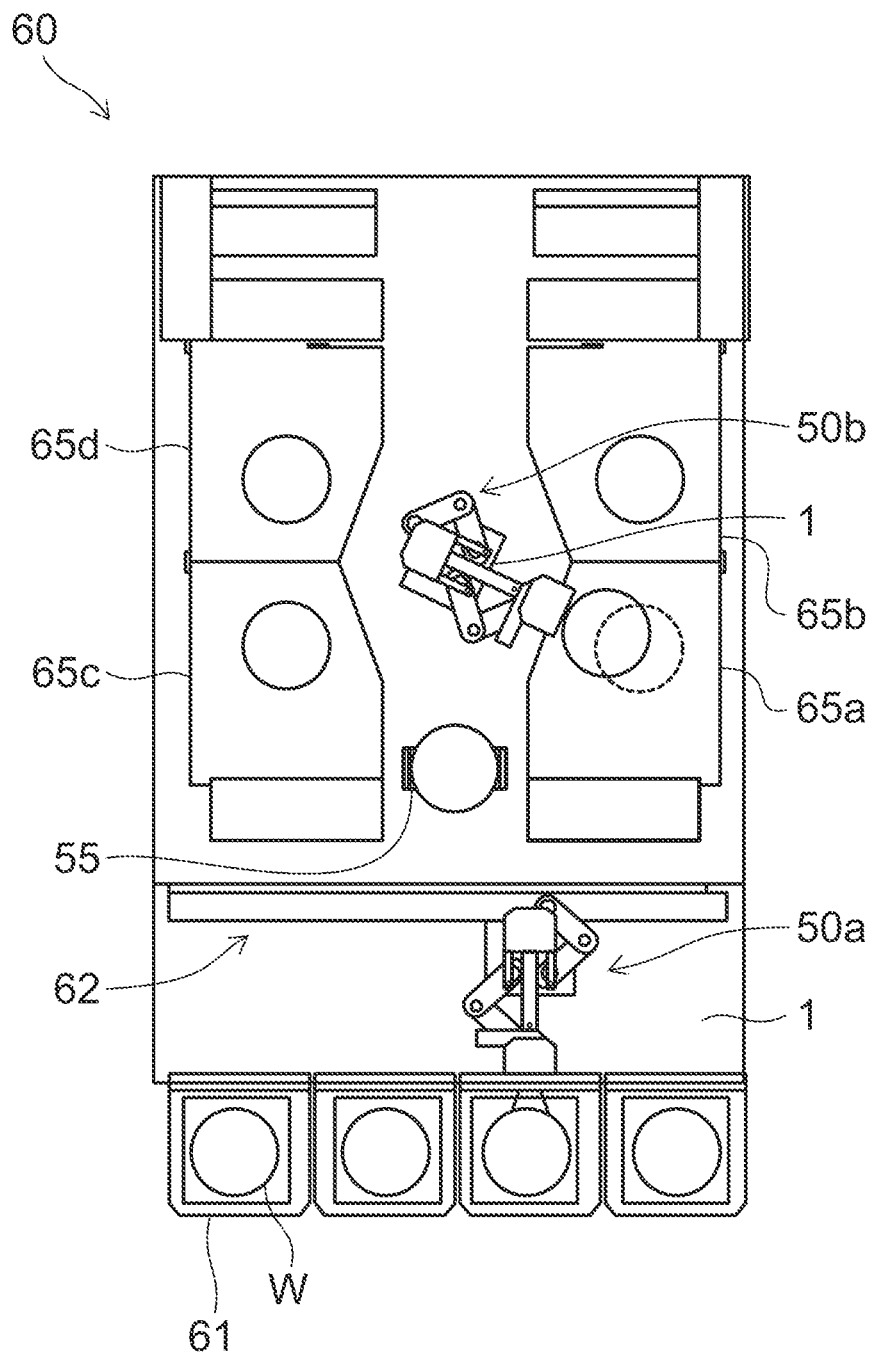
FIG. 9 is a schematic view illustrating the processing device according to the embodiment.

FIG. 9 is a schematic view illustrating the processing device according to the embodiment.

As shown in FIG. 9, a processing device 60 includes the storage unit 61, transfer devices 50a and 50b, the placement unit 55, a moving unit 62, and the processing units 65a to 65d, etc.

The storage unit 61 can be configured to store a plurality of workpieces W in a stack. For example, the storage unit 61 can be a sealed case called a FOUP (Front opening Unified Pod) that can store a plurality of wafers therein.

The transfer devices 50a and 50b can be ones similar to the aforementioned transfer device 50.

The placement unit 55 can be one that places a plurality of workpieces W in a stack as illustrated in FIG. 7, for example.

In this case, the transfer device 50b can be configured to perform operations shown in FIG. 8 using the gripping device 1 as similar to the aforementioned transfer device 50. The transfer device 50a loads and unloads workpieces W between the storage unit 61 and the placement unit 55. In this case, it may be possible to reduce the number of times to load and unload workpieces W by forming the transfer device 50a to grip and transfer a plurality of workpieces W. It may be possible to form the transfer device 50b to load and unload workpieces W between the storage unit 61 and the processing units 65a to 65d.

The placement unit 55 is not necessarily required, which can be appropriately provided depending on the layout or the like of the storage unit 61, transfer devices 50a and 50b, and processing units 65a to 65d.

Figure 10A:
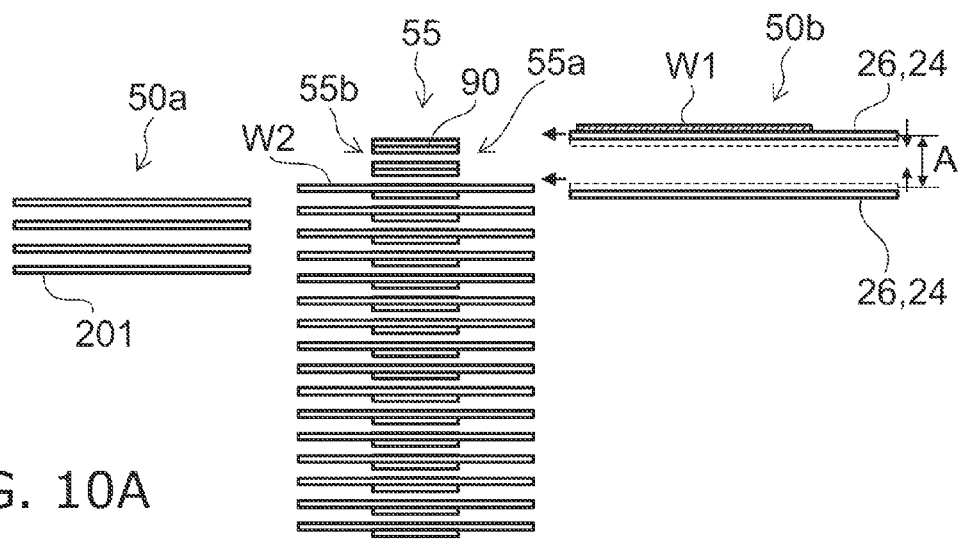
FIGS. 10A to 10C are schematic views illustrating a manner of loading and unloading workpieces at the processing device according to the embodiment.
Figure 10B:
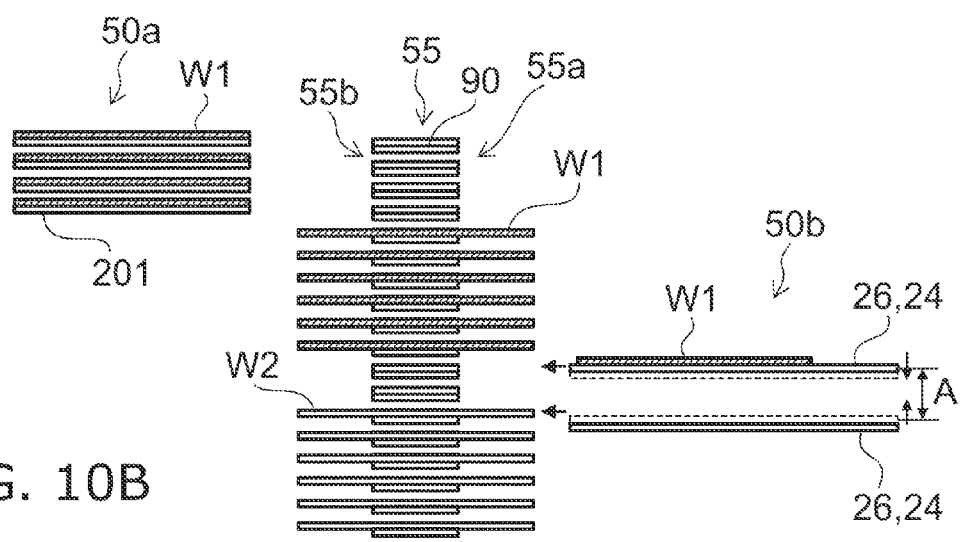
Figure 10C:
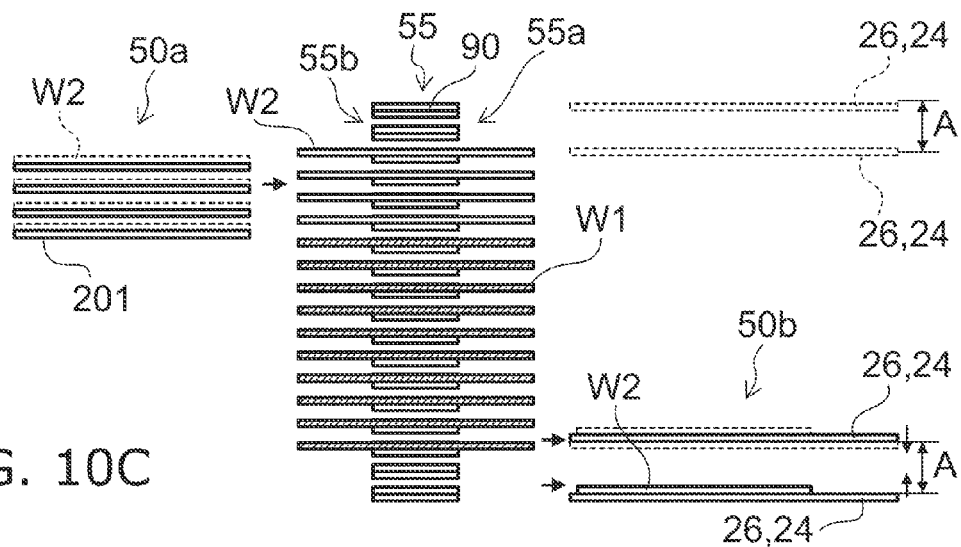

FIGS. 10A to 10C are schematic views illustrating a manner of loading and unloading workpieces at the processing device according to the embodiment.

FIG. 10A shows loading in the topmost stage of the placement unit 55, FIG. 10B shows loading and unloading in the middle stage of the placement unit 55, and FIG. 10C shows loading and unloading in the undermost stage of the placement unit 55.

FIGS. 10A to 10C are diagrams illustrating loading and unloading operations in the case of concurrently performing the loading and unloading of workpieces W by the transfer device 50a and by the transfer device 50b.

As discussed above, the transfer device 50a loads and unloads workpieces W between the storage unit 61 and the placement unit 55, and the transfer device 50b loads and unloads workpieces W between the processing units 65a to 65b and the placement unit 55.

The placement unit 55 includes a plurality of holders 90 that hold the workpiece W. The placement unit 55 has openings 55a and 55b formed therein, through which the transfer device 50a and the transfer device 50b individually make access.

The transfer device 50a is provided with a plurality of gripping devices 201 so as to load and unload a plurality of workpieces W at the same time. The transfer device 50b is provided with two gripping devices 1.

The transfer device 50a begins to store unprocessed workpieces W2 using a holder 90 in the (N+1)th stage from the topmost stage of the placement unit 55. Here, as shown in FIGS. 10A to 10C, N can be the number of the holders 90 provided at pitches of a distance A. The distance A can be a distance between the gripping plates 24 and the gripping plate 26 in the height direction when the gripping device 1 positioned above and the gripping device 1 positioned below in the transfer device 50b individually grip or release the workpiece W. For example, in the case shown in FIGS. 10A to 10C, N is two; the storage of the unprocessed workpieces W2 is started in a holder 90 in the third stage from the topmost stage.

Here, if the unprocessed workpieces W2 are stored above the (N+1)th stage, processed workpieces W1 cannot be stored by the transfer device 50b until this space becomes empty. For this reason, the storage of the unprocessed workpieces W2 is started from the (N+1)th stage to shorten the waiting time for the transfer device 50b.

More specifically, the processed workpieces W1 are allowed to be stored from the topmost stage before the holder 90 in the topmost stage becomes empty, so that the waiting time for the transfer device 50b is shortened.

The moving unit 62 is provided to load and unload workpieces W by the transfer device 50a at a plurality of storage units 61 arranged in a row. In other words, the moving unit 62 is provided to move and position the transfer device 50a toward the front of a predetermined storage unit 61. The moving unit 62 can be a so-called single axis robot, or the like, for example. The moving unit 62 is not necessarily required, which can be appropriately provided depending on the number, layout, or the like of the storage units 61.

It is possible to appropriately select ones that subject workpieces W to various processes for the processing units 65a to 65d. For example, in the case where workpieces W are wafers, glass substrates, or the like, the following can be exemplified: various film deposition devices such as a sputtering device and a CVD (Chemical Vapor Deposition) device; various doping devices such as an oxidation device, thermal diffusion device, and ion implanter; various resist processing devices such as an annealing device, resist coating device, and resist removing device; various etching processing devices such as an exposure device, we etching device, and dry etching device; various cleaning devices such as a we cleaning device and a dry cleaning device; a CMP (Chemical Mechanical Polishing) device, etc. However, the processing units 65a to 65d are not limited thereto, which can be appropriately changed depending on processing for workpieces W. Because it is possible to adapt known techniques to these various devices, the detailed descriptions are omitted.

In the processing device 60 according to the embodiment, the transfer device 50a provided as faced to the storage units 61 loads and unloads workpieces W at the storage units 61 and the placement unit 55. In this case, the moving unit 62 moves and positions the transfer device 50a toward the front of a predetermined storage unit 61. The transfer device 50b provided as faced to the processing units 65a to 65d loads and unloads workpieces W at the processing units 65a to 65d and the placement unit 55.

Because the loading and unloading of workpieces W by the transfer devices 50a and 50b are similar to the case of the aforementioned transfer device 50, the descriptions are omitted.

According to the embodiment, because it is possible to mechanically control the procedures of the grip and release operations and the hoisting and lowering operations, an unnecessary time lag will not occur. Moreover, it is possible to perform accurate operations at high speed.

Furthermore, it is possible to simplify the mechanism of the gripping device and to reduce the weight of the gripping device, so that it is possible to reduce the load on the moving unit, to accelerate the operations, and so on.

Thus, it is possible to shorten a time period required for loading and unloading workpieces W, and it is possible to improve productivity.

Next, a manufacturing method for an electronic device according to the embodiment will be illustrated.

In the manufacturing method for an electronic device according to the embodiment, the gripping device according to the embodiment is used to load and unload workpieces W.

More specifically, the method can include the processes of: unloading an unprocessed workpiece out of the storage unit using the gripping device according to the embodiment; processing the unprocessed workpiece unloaded of the storage unit; and storing the processed workpiece in the storage unit using the gripping device.

In this case, it is also possible to return a workpiece after processed to a place where this workpiece before processed has been unloaded of the storage unit. In other words, it is also possible to unload and store workpieces at the same places in the process of unloading an unprocessed workpiece out of the storage unit and the process of storing this workpiece after processed in the storage unit.

According to the embodiment, because it is possible to mechanically control the procedures of the grip and release operations and the hoisting and lowering operations, an unnecessary time lag will not occur. Moreover, it is possible to perform accurate operations at high speed.

Furthermore, it is possible to simplify the mechanism of the gripping device and to reduce the weight of the gripping device, so that it is possible to reduce the load on the moving unit, to accelerate the operations, and so on.

Thus, it is possible to shorten a time period required for loading and unloading workpieces W, and it is possible to improve productivity.

Hereinabove, the embodiment is illustrated. However, the invention is not limited to these discussions.

One skilled in the art may appropriately modify and alter the design of the foregoing embodiment, and these modifications and alterations are also included in the scope of the invention as long as these modifications and alterations have the features of the invention.

For example, the shapes, sizes, layouts, numbers, and so on of components provided on the gripping device 1, transfer device 50, processing device 60, or the like are not limited to those illustrated in the embodiment, which can be appropriately modified and altered.

Such a configuration is illustrated that the screw 3 and the nut 4 are used in the gripping device 1. However, it may be possible to transform the rotational motion of the motor 2 to translatory movement using a belt, pulley, etc. More specifically, it is sufficient to provide ones that can move the motion control unit 14 in straight lines.

The number, layout, and so on of the storage unit, transfer device, placement unit, moving unit, processing unit, or the like in the processing device 60 are not limited to those illustrated in the embodiment, which can be appropriately modified and altered.

In addition, the components provided in the aforementioned embodiment may be combined as much as possible, and those having the combinations are also included in the scope of the invention as long as they contain the features of the invention.

What is claimed is:

1. A gripping device that grips a rim of a workpiece by opening and closing gripping plates, the device comprising:
a gripping unit including:
a first gripping plate having a first gripper to contact the rim; and
a second gripping plate having a second gripper to contact the rim,
at least one of the first gripping plate and the second gripping plate being moved and the first gripper and the second gripper being spaced from each other;
a hoisting and lowering unit configured to hoist and lower the gripping unit, the moving direction of the hoisting and lowering unit being perpendicular to the moving direction of the first gripping plate and the second gripping plate; and
a motion control unit configured to control open/close operations by the gripping unit and hoisting and lowering operations by the hoisting and lowering unit,
the motion control unit having one or more cams, and
the motion control unit mechanically controlling first first hoisting and lowering operations, second the open/close operations, and third second hoisting and lowering operations that perform hoisting and lowering in directions being same as directions in the first hoisting and lowering operations,
wherein each of the one or more cams includes a cam hole engaging with a cam follower provided on the hoisting and lowering unit, and
the cam hole includes a first slope unit, a horizontal unit provided in contact with the first slope unit, and a second slope unit provided in contact with the horizontal unit.

2. The device according to claim 1, further comprising:
an open/close synchronizing unit configured to reverse a moving direction of the first gripping plate and a moving direction of the second gripping plate to each other.

3. The device according to claim 1, wherein
the motion control unit mechanically controls first the first hoisting and lowering operations, controls second the open/close operations, and controls third the second hoisting and lowering operations using the one or more cams.

4. The device according to claim 1,
wherein if the first and second hoisting and lowering operations are a hoisting operation, the open/close operations are operations that contact the first gripper and the second gripper with the rim of the workpiece.

5. The device according to claim 1,
wherein if the first and second hoisting and lowering operations are a lowering operation, the open/close operations are operations that separate the first gripper and the second gripper from the rim of the workpiece.

6. The device according to claim 2, wherein
the open/close synchronizing unit has a rack and pinion mechanism or link mechanism; and
the open/close synchronizing unit reverses a moving direction of the first gripping plate and a moving direction of the second gripping plate to each other using the rack and pinion mechanism or link mechanism.

7. The device according to claim 1, further comprising:
a driving unit including:
a motor;
a screw mounted on a rotating shaft of the motor; and
a nut screwed on the screw, transforming rotation motion of the motor into translatory movement and transmitting the translatory movement to the motion control unit,
the motion control unit being moved along the screw by the rotation motion of the motor.

8. The device according to claim 1, wherein
the motion control unit includes a pair of cams provided opposed to each other,
two cam holes are provided on each of the pair of cams, and
all cam holes provided on the pair of cams have a similar figure.

9. The device according to claim 7, wherein
the gripping unit includes a mounting plate mounting the second gripping plate,
the driving unit includes an open/close plate being moved in conjunction with the motion control unit,
the open/close plate includes a first projection provided to contact an end surface of the mounting plate, and
the open/close plate is moved with movement of the motion control unit and open/close operation in the gripping unit is performed via the first projection and the mounting plate by movement of the open/close plate.

10. The device according to claim 9, wherein
the driving unit includes a base plate on which the motor is mounted and a stopper erected on the base plate,
the open/close plate includes a second projection provided to contact the stopper, and
the open/close plate stops moving when the second projection contacts the stopper and open/close operation in the gripping unit stops when the open/close plate stops the moving.

11. A transfer device comprising:
a gripping device; and
a moving unit configured to change a position of the gripping device,
the gripping device that grips a rim of a workpiece by opening and closing gripping plates, the device including:
a gripping unit including:
  a first gripping plate having a first gripper to contact the rim; and
  a second gripping plate having a second gripper to contact the rim,
  at least one of the first gripping plate and the second gripping plate being moved and the first gripper and the second gripper being spaced from each other;
a hoisting and lowering unit configured to hoist and lower the gripping unit, the moving direction of the hoisting and lowering unit being perpendicular to the moving direction of the first gripping plate and the second gripping plate; and
a motion control unit configured to control open/close operations by the gripping unit and hoisting and lowering operations by the hoisting and lowering unit,
the motion control unit having one or more cams, and
the motion control unit mechanically controlling first first hoisting and lowering operations, second the open/close operations, and third second hoisting and lowering operations that perform hoisting and lowering in directions being same as directions in the first hoisting and lowering operations,
wherein each of the one or more cams includes a cam hole engaging with a cam follower provided on the hoisting and lowering unit, and
the cam hole includes a first slope unit, a horizontal unit provided in contact with the first slope unit, and a second slope unit provided in contact with the horizontal unit.

12. The device according to claim 11, wherein:
the gripping device is provided above and below in two; and
hoisting and lowering operations of a first gripping device positioned above and hoisting and lowering operations of a second gripping device positioned below the first gripping device are performed in reverse directions to each other.

13. The device according to claim 11,
wherein the moving unit is one selected from one of the group consisting of a horizontal articulated robot, a vertical articulated robot, an orthogonal robot, and a single axis robot.

14. A processing device comprising:
a transfer device including a gripping device, and a moving unit configured to change a position of the gripping device;
a storage unit configured to store a plurality of workpieces in a stack; and
a processing unit configured to process the workpieces,
the gripping device that grips a rim of a workpiece by opening and closing gripping plates, the device including:
a gripping unit including:
  a first gripping plate having a first gripper to contact the rim; and
  a second gripping plate having a second gripper to contact the rim,
  at least one of the first gripping plate and the second gripping plate being moved and the first gripper and the second gripper being spaced from each other;
a hoisting and lowering unit configured to hoist and lower the gripping unit, the moving direction of the hoisting and lowering unit being perpendicular to the moving direction of the first gripping plate and the second gripping plate; and
a motion control unit configured to control open/close operations by the gripping unit and hoisting and lowering operations by the hoisting and lowering unit,
the motion control unit having one or more cams, and
the motion control unit mechanically controlling first first hoisting and lowering operations, second the open/close operations, and third second hoisting and lowering operations that perform hoisting and lowering in directions being same as directions in the first hoisting and lowering operations,
wherein each of the one or more cams includes a cam hole engaging with a cam follower provided on the hoisting and lowering unit, and
the cam hole includes a first slope unit, a horizontal unit provided in contact with the first slope unit, and a second slope unit provided in contact with the horizontal unit.

15. A manufacturing method for an electronic device comprising:
unloading an unprocessed workpiece out of a storage unit using a gripping device;
processing the unprocessed workpiece unloaded from the storage unit; and
storing the processed workpiece in the storage unit using the gripping device
the gripping device that grips a rim of a workpiece by opening and closing gripping plates, the device including:
a gripping unit including:
  a first gripping plate having a first gripper to contact the rim; and
  a second gripping plate having a second gripper to contact the rim,
  at least one of the first gripping plate and the second gripping plate being moved and the first gripper and the second gripper being spaced from each other;
a hoisting and lowering unit configured to hoist and lower the gripping unit, the moving direction of the hoisting and lowering unit being perpendicular to the moving direction of the first gripping plate and the second gripping plate; and a motion control unit configured to control open/close operations by the gripping unit and hoisting and lowering operations by the hoisting and lowering unit, the motion control unit having one or more cams, and the motion control unit mechanically controlling first first hoisting and lowering operations, second the open/close operations, and third second hoisting and lowering operations that perform hoisting and lowering in directions being same as directions in the first hoisting and lowering operations, wherein each of the one or more cams includes a cam hole engaging with a cam follower provided on the hoisting and lowering unit, and the cam hole includes a first slope unit, a horizontal unit provided in contact with the first slope unit, and a second slope unit provided in contact with the horizontal unit.

16. The method according to claim 15, wherein a place where the unprocessed workpiece is unloaded in the unloading the unprocessed workpiece out of the storage unit and a place where the processed workpiece is stored in the storing the processed workpiece using the gripping device are identical.

* * * * *